US006784625B1

(12) United States Patent
Andrews

(10) Patent No.: US 6,784,625 B1
(45) Date of Patent: Aug. 31, 2004

(54) EMI REDUCTION OF VOLTAGE INVERTERS BY WAY OF CONTROLLED RANDOMIZED MODULATION OF OSCILLATING SIGNALS

(75) Inventor: Michael Andrews, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/426,408

(22) Filed: Apr. 30, 2003

(51) Int. Cl.[7] .......................... H05B 41/16; H03D 3/24

(52) U.S. Cl. ....................................... 315/276; 375/376

(58) Field of Search ................................ 315/291, 276, 315/307, 209 R, DIG. 4, DIG. 7; 375/376, 375

(56) References Cited

U.S. PATENT DOCUMENTS

| | | | | | |
|---|---|---|---|---|---|
| 5,109,185 | A | * | 4/1992 | Ball | 323/207 |
| 5,216,713 | A | | 6/1993 | Lindholm | |
| 5,263,055 | A | | 11/1993 | Cahill | |
| 5,321,409 | A | | 6/1994 | Walker | |
| 5,488,627 | A | | 1/1996 | Hardin | |
| 5,943,382 | A | * | 8/1999 | Li et al. | 375/376 |
| 6,021,054 | A | | 2/2000 | Ueki | |
| 6,031,299 | A | | 2/2000 | Stumfall | |
| 6,031,366 | A | | 2/2000 | Mitsuishi | |
| 6,031,414 | A | | 2/2000 | Kitamura | |
| 6,058,030 | A | | 5/2000 | Hawkes | |
| 6,072,282 | A | * | 6/2000 | Adamson | 315/276 |
| 6,075,716 | A | | 6/2000 | He | |
| 6,160,861 | A | * | 12/2000 | McCollough | 375/376 |

OTHER PUBLICATIONS

R. Rovatti, G. Setti, S. Graffi, "Chaos–Based FM of Clock Signals for EMI Reduction" 14th European Conference on Circuit Theory and Design (ECCTD '99) pp 373–376.

J.H.B. Deane and D. C. Hamill, "Improvement Of Power Supply EMC by Chaos" (Jun. 6, 1996) Electronics Letters, vol. 32 No. 12, p 1045.

R. Giral, et al. "Current Control Technique For Improving EMC in Power Converters" (Mar. 1, 2001) Electronics Letters, vol. 37, No. 5, pp. 274–275.

Yoshifumi Nishio, et al. "Extremely Simple Hyperchaos Generators Including One Diode" 0–7803–0593–0/921992 IEEE, pp 2797–2800.

Aleksandar M. Stankovic, et al. "Randomized Modulation in Power Electronic Converters" (May 2002) Proceedings Of The IEEE, vol. 90, No. 5, pp 782–799.

Manuel Delgado–Restituto, et al. Integrated Chaos Generators, (May 2002) Proceedings Of the IEEE, vol. 90, No. 5, pp. 747–767.

* cited by examiner

*Primary Examiner*—Don Wong
*Assistant Examiner*—Chuc Tran
(74) *Attorney, Agent, or Firm*—Kyle J. Way

(57) ABSTRACT

A switching control circuit for a voltage inverter generates an oscillating signal that causes reduced electromagnetic interference by the voltage inverter by way of modulating the frequency of the oscillating signal within a specified frequency range. A randomized signal generator creates a randomized signal, which is then used to drive a frequency range converter that is employed to produce a frequency modulation signal. The current state of the frequency modulation signal is based on the current state of the randomized signal, with the frequency range converter limiting the current state of the frequency modulation signal so that the oscillating signal will only operate within the specified frequency range. A variable frequency oscillator then generates the oscillating signal whose frequency is based on the current state of the frequency modulation signal. The oscillating signal is then inverted to produce an inverted oscillating signal, with both the oscillating signal and the inverted oscillating signal then driving the voltage inverter.

34 Claims, 7 Drawing Sheets

EMI REDUCTION OF VOLTAGE INVERTERS BY WAY OF CONTROLLED RANDOMIZED MODULATION OF OSCILLATING SIGNALS

BACKGROUND OF THE INVENTION

Most modern electronic devices manufactured today contain at least one electrical signal line which is an unwanted source of electrical "noise", thereby adversely affecting other electronic circuits, both within and external to the electronic device. Generally speaking, this noise exists in the form of electromagnetic interference (EMI) of nearby electrical signals by the offending electrical signal. This EMI may be conducted from the offending electrical signal line to others by way of an electrically conductive path. Alternately, the interference may be radiated from the offending electrical signal line to nearby circuits without the benefit of a directly conductive connection. Oftentimes, the result of such radiated or conducted noise is erroneous or improper operation of the circuit being affected by the EMI, due primarily to unexpected voltage changes in the affected circuit. As a result, protecting electrical circuits from EMI that is generated by other signal lines has long been an important facet of the electronic circuit and device design process.

One example of a source of such noise is a voltage inverter, such as a Royer DC/AC (direct-current/alternating-current) inverter from the prior art designed to convert a DC power source into an AC power source. Voltage inverters are used in many different electronic applications. Specifically with respect to laptop computers and other electronic instruments employing flat panel displays, voltage inverters are often utilized as the power source for the backlight required for those displays. Due to the switching nature of voltage inverters and the large relative current levels typically involved, significant amounts of EMI are both radiated and conducted into surrounding circuitry located within the device utilizing the voltage inverter. The power spectral density of this EMI typically takes the form of noise spikes at the fundamental frequency and harmonic frequencies at which the voltage inverter oscillates.

Several methods of protecting circuits from EMI generated by voltage inverters have been employed previously. Many such methods involve protecting the sensitive circuits of the electronic device involved from the noise effects of the inverter. For example, the electronic circuit designer often attempts to structure the physical layout of the electronic circuits on a printed circuit board (PCB) so that the generated EMI of the inverter will have an attenuated effect on other surrounding circuits. Such efforts include physically routing any offending signals remotely from other sensitive signal lines and circuits, utilizing additional ground planes within the PCB to electrically shield and separate the voltage inverter from surrounding circuits, and the like. Unfortunately, such efforts normally require exorbitant amounts of a PCB designer's time and effort, and are also error-prone, requiring multiple circuit design revisions in order to reduce sufficiently the effects of the noise on the device.

Other similar solutions involve more substantive circuit additions to shield radiated and conducted noise from circuits that are sensitive to that noise. These additions include the use of large and complex filters on the PCB, chokes, additional metal shielding, shielded cables, and so on.

In contrast to the solutions above, more recent approaches to the problem involve changing the nature of the offending circuit to make the oscillating signal involved less of a noise source to surrounding circuitry. For example, one proposed solution has been to "dither" the switching frequency of the inverter by adding a small noise signal to the signal responsible for the oscillation. Dithering of this signal results in displacing the frequency spectrum of the offending noise a small amount, but does not lower the power level of the frequency spectrum. This solution has been utilized in devices in which other circuits within the device are sensitive to noise at particular frequencies, because the small displacement in the frequency spectrum of the oscillating signal may aid in reducing the effects of the noise on that circuit. However, many electronic devices are susceptible to noise across a wide range of frequencies, making this solution inapplicable in such cases. For example, dithering of the oscillating signal is particularly ineffective for electronic devices such as electronic test and measurement instruments, which often are employed to investigate electronic signals over a very wide band of the frequency spectrum.

Other prior art solutions, such as those indicated in "Current control technique for improving EMC in power converters," ELECTRONIC LETTERS, Vol. 37, No. 5, pp. 274–275 (Mar. 1, 2001) by Giral et al., and "Improvement of power supply EMC by chaos," ELECTRONIC LETTERS, Vol. 32, No 12, p. 1045 (Jun. 6, 1996) by Deane et al., focus on the use of chaotic control of DC/DC power converters to reduce the electromagnetic interference normally generated by such circuits. Such solutions succeed in reducing the peaks of the frequency spectrum due to the control signal associated with such converters by spreading out the power of the spectrum at the fundamental and harmonic frequencies. However, such solutions typically do not ensure failsafe operation of the converter being driven by the offending control signal due to its chaotic nature. Adding chaotic control as described by the prior art does not guarantee that the switch will not remain in the closed position, thus potentially causing permanent damage to the inductor of the converter by way of sustained electrical current. By the same token, the circuit described may not prevent excessive periods of time during which the inductor is not being charged, thus allowing the output voltage of the power supply to drop unacceptably.

Another solution, identified by Cahill in U.S. Pat. No. 5,263,055, entitled "APPARATUS AND METHOD FOR REDUCING HARMONIC INTERFERENCE GENERERATED BY A CLOCK SIGNAL", implements a periodic clock signal that is frequency modulated, or alternately, phase modulated, by the output of a pseudorandom noise signal generator. While the power spectral energy of the fundamental and harmonic frequencies of the periodic clock signal is reduced, no control mechanism is present which ensures that the changing frequency of the modulated signal remains within the limits required of the circuit that is being driven by that signal. Hence, such a method, as applied to a DC/AC voltage inverter, is also likely to allow the inverter to remain in a nonswitching state for lengthy periods of time occasionally.

From the foregoing, despite previous attempts to mitigate or reduce EMI generated by DC/AC voltage inverters, a need still exists for a reliable method of reducing the EMI generated by such inverters. Such a method should both reduce the EMI generated while ensuring that the timing characteristics of the control signal driving the voltage inverter reside within a specified range to ensure effective, nondestructive operation of the inverter and its load.

SUMMARY OF THE INVENTION

Embodiments of the invention, to be discussed in detail below, provide a switching control circuit for a voltage inverter. A randomized signal generator is employed to create a randomized signal used as input for a frequency range converter. This range converter, in turn, produces a frequency modulation signal, the current state of which is based on the current state of the randomized signal. Additionally, the frequency range converter limits the current state of the frequency modulation signal so that the oscillating signal that is ultimately produced will operate within the specified frequency range. A variable frequency oscillator then generates the oscillating signal, the frequency of which is based on the current state of a frequency modulation signal. A logic inverter then inverts the oscillating signal. Both the oscillating signal and the inverted oscillating signal are then employed to drive the voltage inverter.

By modulating the frequency of the oscillating signal in this manner, the overall EMI produced by the operation of the voltage inverter is reduced in comparison to those voltage inverters that employ oscillating signals of a fixed frequency. Furthermore, by restricting the frequency of the oscillating signal to the specified frequency range, the proper operation of the voltage inverter driven by the oscillating signal and its inverted counterpart is maintained, thus helping to prevent unacceptable voltage dropouts and irreparable damage to the inverter or its load.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 1:
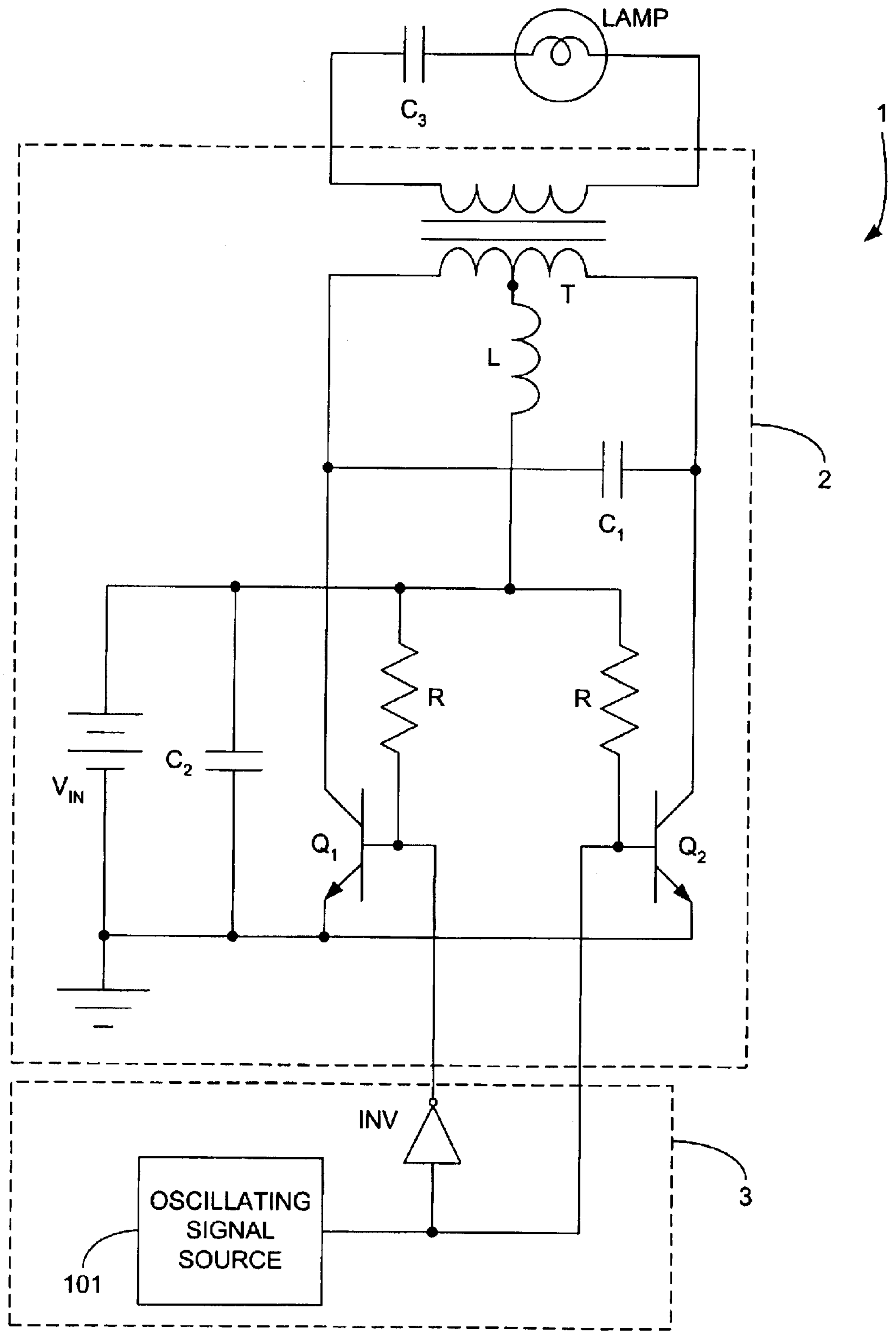
FIG. 1 is a schematic representation of voltage inverter according to embodiments of the invention.

An example of a voltage inverter utilizing a switching control circuit according to an embodiment of the invention is presented in FIG. 1. A lamp, such as a cold cathode fluorescent lamp (CCFL), existing in series with a capacitor $C_3$, is to be driven using a DC input voltage source $V_{IN}$. To energize the lamp properly, an AC voltage must be derived from the DC source, in this case by way of a Royer-type inverter 2. Typical of other classic Royer voltage inverters, the secondary winding of a transformer T is used to drive the load, which is the lamp. The primary winding of the transformer is driven at each end of the winding by two transistors $Q_1$, and $Q_2$. Under normal operation, $Q_1$ and $Q_2$ alternate turning ON and OFF at a particular frequency dictated by the needs of the lamp. Generally, while Q1 is OFF, Q2 is ON, and vice versa, thus generating the AC voltage across the primary winding necessary to drive the lamp. Whether each of the transistors $Q_1$, and $Q_2$ are ON depends on the voltage applied to the transistor base, with higher voltages tending to turn the transistors $Q_1$ and $Q_2$ ON, and lower voltages turning them OFF.

In most Royer-type and similar voltage inverters, the bases of the transistors $Q_1$ and $Q_2$ are attached to supplemental primary windings of the transformer T so that the AC voltage across the primary windings will cause the transistors $Q_1$ and $Q_2$ to turn ON and OFF automatically in the proper alternating sequence. However, such control of the transistors $Q_1$ and $Q_2$ tends to allow the voltage inverter 2 to switch at a consistent fundamental frequency, thus generating significant EMI at that frequency, as well as at various harmonics of that frequency.

To prevent this phenomenon, a switching control circuit 3 is utilized instead to drive the transistors $Q_1$ and $Q_2$ by way of an electrical circuit 101 which generates an oscillating signal whose frequency is modulated in a nonlinear or chaotic fashion to reduce the power spectral density of the voltage inverter 2, thus reducing conducted and radiated EMI into surrounding electronic circuitry. The oscillating signal is then logically inverted by way of an inverter INV so that both the inverted oscillating signal and the original oscillating signal are employed to drive the bases of the transistors $Q_1$, and $Q_2$, respectively, so that an AC voltage of varying frequency is applied at the primary winding of the transform T. The electrical circuit 101 is designed to control the frequency of the oscillating signal so that voltage dropouts do not occur across the lamp, degrading the performance of the lamp in the process. Also, any damage to the voltage inverter 2 or its load will be prevented by restriction of the frequency of the oscillating signal within prescribed design limits.

While the particular example of a Royer-type inverter circuit 2 is involved in relation to the disclosed embodiments of the invention, other types of inverter circuits requiring switching control of the general type described herein are also contemplated.

Figure 2:
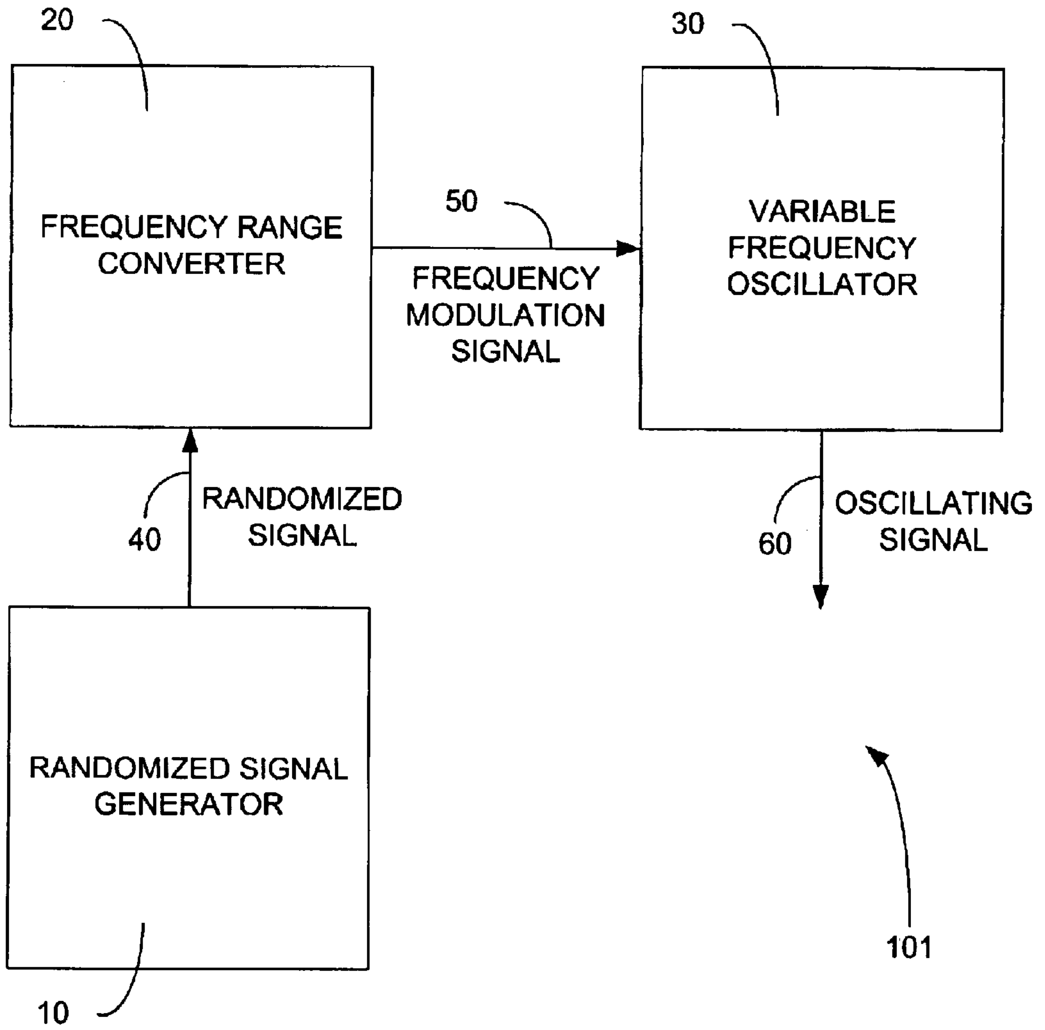
FIG. 2 is a high-level block diagram of a portion of a voltage inverter switching control circuit according to an embodiment of the invention that generates an oscillating signal.

An example of the electrical circuit 101 from FIG. 1 for generating a oscillating signal that is employed in a switching control circuit of a voltage inverter is shown in FIG. 2. Generally speaking, a randomized signal generator 10 is employed to generate a randomized signal 40, which is then transferred to a frequency range converter 20. The frequency range converter 20 then produces a frequency modulation signal 50 based on the current state of the randomized signal 40. The current state is the current value of the particular characteristic of the signal that is being randomized. In the following embodiments, voltage is the randomized characteristic, but others, such as current, frequency, ON duration time, and phase may also be utilized. The frequency modulation signal 50 then drives a variable frequency oscillator 30, which generates an oscillating signal 60 that has a frequency based on the current state of the frequency modulation signal 50. To ensure that the oscillating signal 60 remains within a specified frequency range, the frequency range converter 20 limits the frequency modulation signal 50 so that the frequency of the oscillating signal 60 always operates within that frequency range. That frequency range is determined primarily by the technical requirements of the voltage inverter being driven by the oscillating signal 60, the nature of the load to which power ultimately is being supplied, and other factors.

Concerning the randomized signal generator 10, the randomized signal 40 exhibits characteristics similar to what is commonly termed "white noise." In the context of the present invention, white noise is an electrical signal that possesses a continuous, uniform power spectral density over a particular frequency range. However, the randomized signal 40 need not exhibit complete or perfect uniformity in its power spectral density for most embodiments of the present invention, as sufficient reduction in EMI exhibited by the oscillating signal 60 ordinarily results from a less-than-perfect randomized signal 40.

Figure 3:
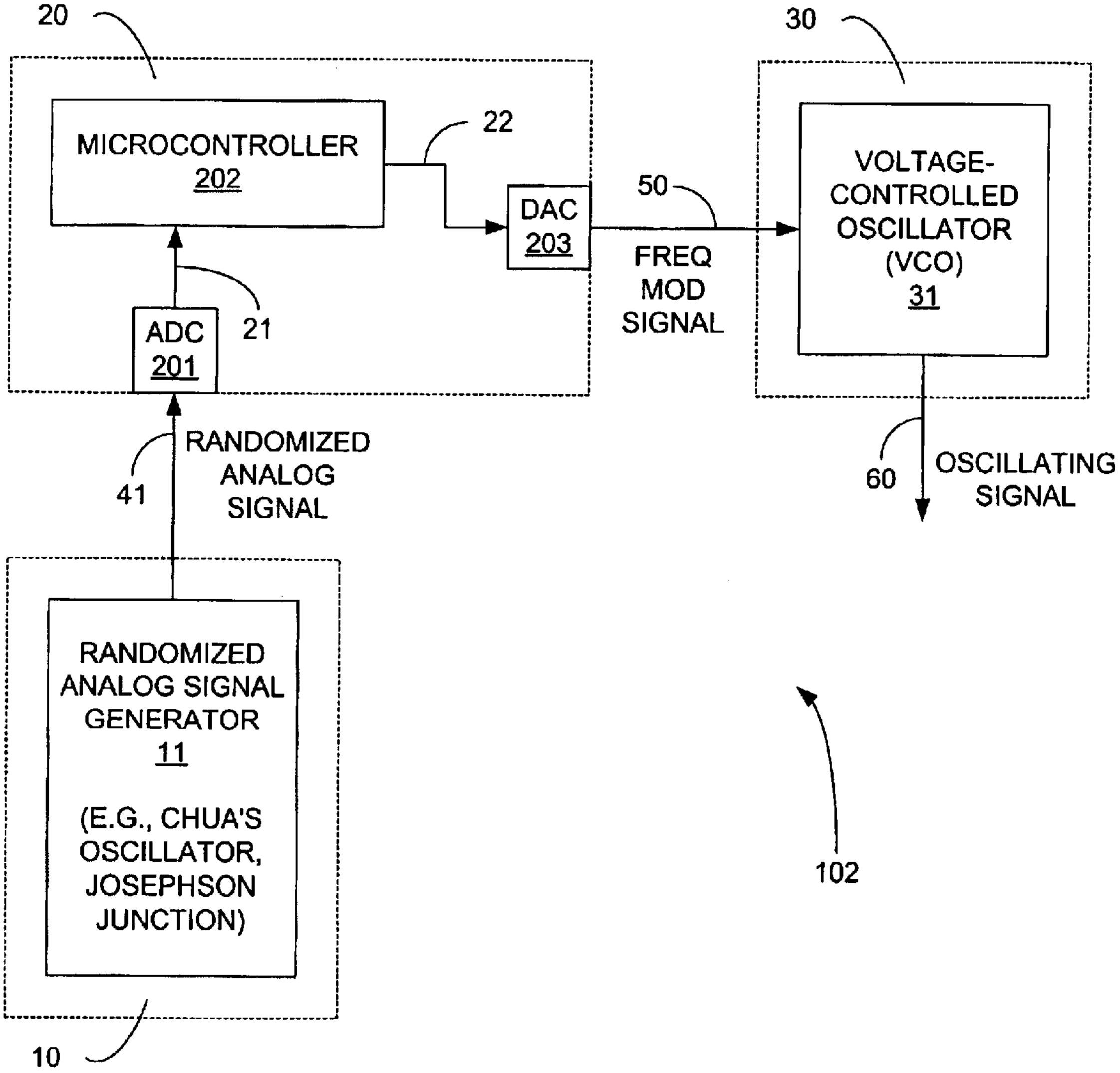
FIG. 3 is a more detailed block diagram of a portion of a voltage inverter switching control circuit according to an embodiment of the invention that generates an oscillating signal.

The randomized signal 40 generated by the randomized signal generator 10 may be, for example, a randomized analog signal 41 (as shown in FIG. 3), the voltage of which varies with time. In this case, the voltage of the randomized analog signal 41 would be used for modulation purposes, as described below. Thus, in such an embodiment, the randomized signal generator 10 would be a randomized analog signal generator 11 (also shown in FIG. 3).

Many different types of electrical circuits that generate noise could be employed for the randomized analog signal generator 11. For example, a Josephson junction may be used for such a purpose. A Josephson junction, as described in the prior art, is a small circuit consisting of two layers of superconductor material separated by a thin nonsuperconductor. Although the Josephson junction is known primarily for extremely high switching speeds at very low temperatures, the thermal noise demonstrated by such a junction at higher temperatures is highly nonlinear and randomized in nature.

Another type of randomized analog signal generator 11 is Chua's oscillator, a nonlinear, chaotic oscillator well known in the art. Chua's oscillator also possesses the added advantage of producing a randomized analog signal 41 whose frequency range may be limited with proper selection of the values of the circuit components, such as resistors and capacitors, which make up the oscillator. Many other similar electrical circuits that generate randomized or chaotic electrical analog signals may also be employed as the randomized analog signal generator 11.

Figure 4:
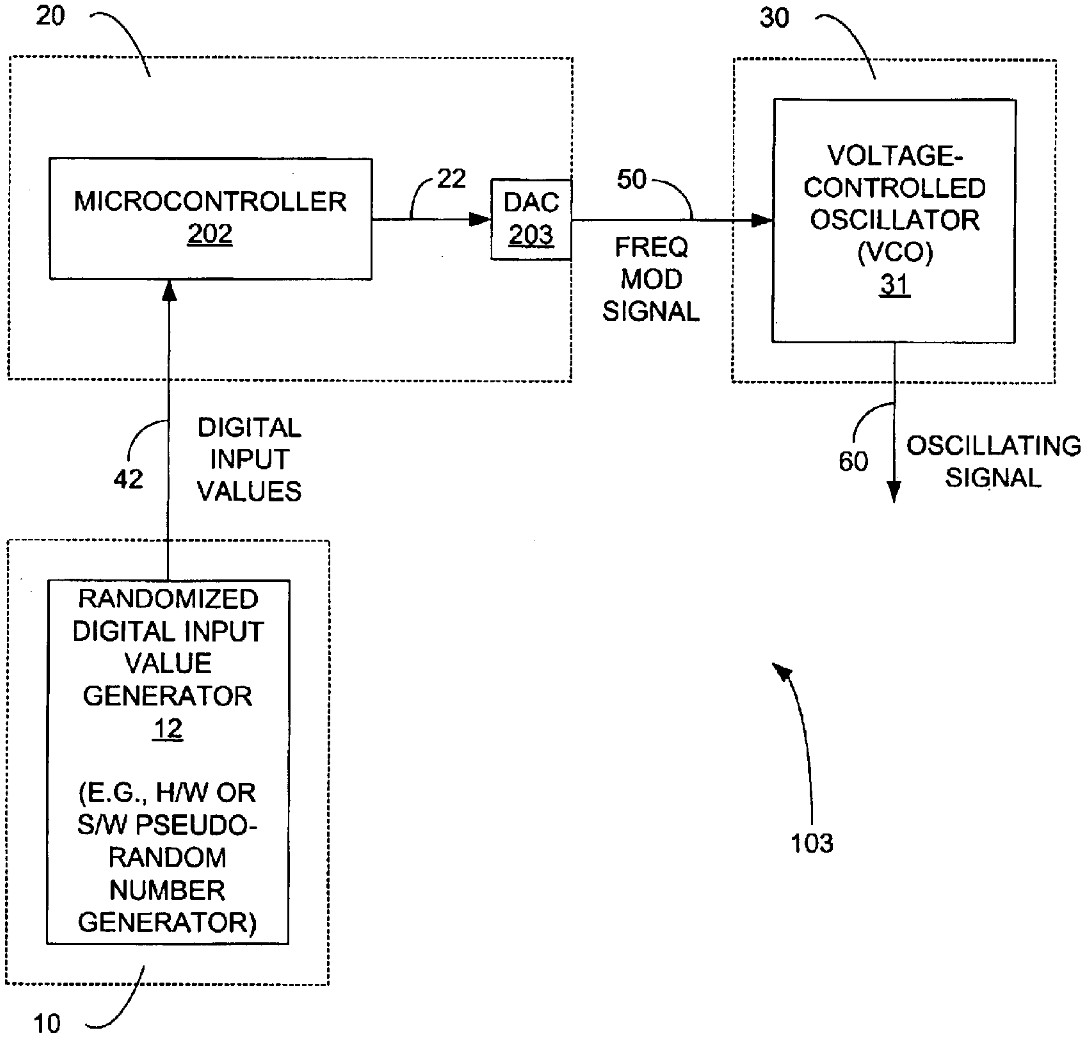
FIG. 4 is a more detailed block diagram of a portion of a voltage inverter switching control circuit according to another embodiment of the invention that generates an oscillating signal.

The randomized signal 40 may also take the form of a series of randomized digital input values 42 generated by another type of randomized signal generator 10: a randomized digital input value generator 12, as shown in FIG. 4. For example, a hardware random or pseudorandom number generator may be employed to generate the series of randomized digital input values 42. Hardware random number generators normally utilize some randomized physical process, such as a thermal noise generation circuit, to generate a series of random numbers. Hardware pseudorandom number generators employ a hardware implementation of a mathematical algorithm to generate a series of numbers that appear quite random, but are still deterministic if enough is known about the algorithm. Hardware random and pseudorandom number generators may be embodied in field-programmable gate arrays (FPGAs), application-specific integrated circuits (ASICs) or similar integrated circuits (ICs). Also, a software implementation of a pseudorandom number generator may also be employed. Such software algorithms are commonly performed using, for example, a microcontroller, which may be a microprocessor or similar computer-based circuit capable of running a computer program or algorithm.

The randomized signal 40 generated by the randomized signal generator 10 is then used to drive a frequency range converter 20. In the embodiment of FIG. 3, in which a randomized analog signal 41 is employed, an analog-to-digital converter (ADC) 201 is used to periodically convert the randomized analog signal 41 into a series of digital input values 21 for use by a microcontroller 202. The microcontroller 202 then generates a digital output value 22 based on each digital input value 21 received from the ADC 201. Each digital output value 22 is then converted back to an analog voltage by way of a digital-to-analog converter (DAC), thus creating the frequency modulation signal 50.

The frequency range converter 20 ensures that no digital output value 22 causes the oscillating signal 60 of the variable frequency oscillator 30 to operate outside the specified frequency range. A simple method for meeting this requirement is to pass all digital input values 21 unmodified as digital output values 22 that result in a proper frequency for the oscillating signal 60. For those digital input values 21 that do not result in a proper frequency for the oscillating signal 60, the frequency range converter 20 may "clip" impermissibly high digital output values 22 so that the frequency modulation signal 50 causes the generation of the oscillating signal 60 at the highest allowable frequency within the specified range. Likewise, impermissibly low digital output values 22 may be "boosted" so that the frequency of the oscillating signal 60 is no lower than that allowed. Optionally, those digital input values 21 that fall outside of a prescribed range may be "mapped" to other values within the range. Such mapping may be either constant or variably dependent on previous digital input values 21 received by the frequency range converter 20.

More sophisticated methods of ensuring that the frequency of the oscillating signal 60 remains within its specified range may also be employed. For example, if the ultimate range of digital input values 21 is known with certainty, the frequency range converter 20 may then "scale" the digital input values 21 to a broader or narrower range of digital output values 22 so that the range of digital output values 22 being produced closely matches the frequency range specified for the oscillating signal 60. Optionally, clipping and boosting may then be applied atop this scaling algorithm to ensure that the frequency restrictions of the oscillating signal 60 are met.

Other algorithms that produce digital output values 22 based on the digital input values 21 that allow the oscillating signal 60 to operate within the specified frequency range may also be employed.

As noted above, in the embodiment shown in FIG. 4, the frequency range converter 20 may receive a series of randomized digital input values 42. In that particular case, the microcontroller 202 receives these values directly, as opposed to being converted by an ADC. Furthermore, if the randomized digital input values 42 are generated by a software algorithm on a microcontroller, a single microcontroller may serve as both the randomized digital input value generator 12 and the microcontroller 202 of the frequency range converter 20, thus reducing the amount of hardware required to implement this particular embodiment of the invention.

In some embodiments, the frequency range may be predetermined by being permanently set within the design of the frequency range converter 20 of the electrical circuit 101. This type of embodiment would be appropriate for cases in which the range of operation of the circuit is known at the time of the design. In other embodiments, the use of a modifiable frequency range, allowing programmability of both the extent of the allowed frequency range, and its location within the frequency spectrum, may be desirable. For example, in the case of a test and measurement instrument employed to analyze electrical signals at a variety of frequencies, control over the allowed frequency range of the oscillating signal 60 may be desirable, with the range being dependent on the frequency range of the signals being analyzed at a particular time.

Similarly, alternate embodiments of the present invention may also allow either a modulated version of the oscillating signal 60, as described above, or an unmodulated oscillating signal 60 operating at some fundamental frequency. This option may be desirable in circumstances where operation of the voltage inverter at a single frequency at times presents no problem to nearby electronic circuits.

The frequency modulation signal 50, produced by the frequency range converter 20, then drives a variable frequency oscillator 30, which generates the oscillating signal 60, the frequency of which depends on the current state of the frequency modulation signal 50. In the embodiments of the electrical circuit 102, 103, shown in FIG. 3 and FIG. 4, the variable frequency oscillator 30 is a voltage-controlled oscillator (VCO) 31. As is well known in the art, a VCO generates an output signal of a particular frequency based on the voltage present at the input of the VCO, with a higher voltage causing the output to operate at a higher frequency. Thus, as the voltage of the frequency modulation signal 50 increases or decreases, the frequency of the oscillating signal 60 tracks those changes.

Figure 5:
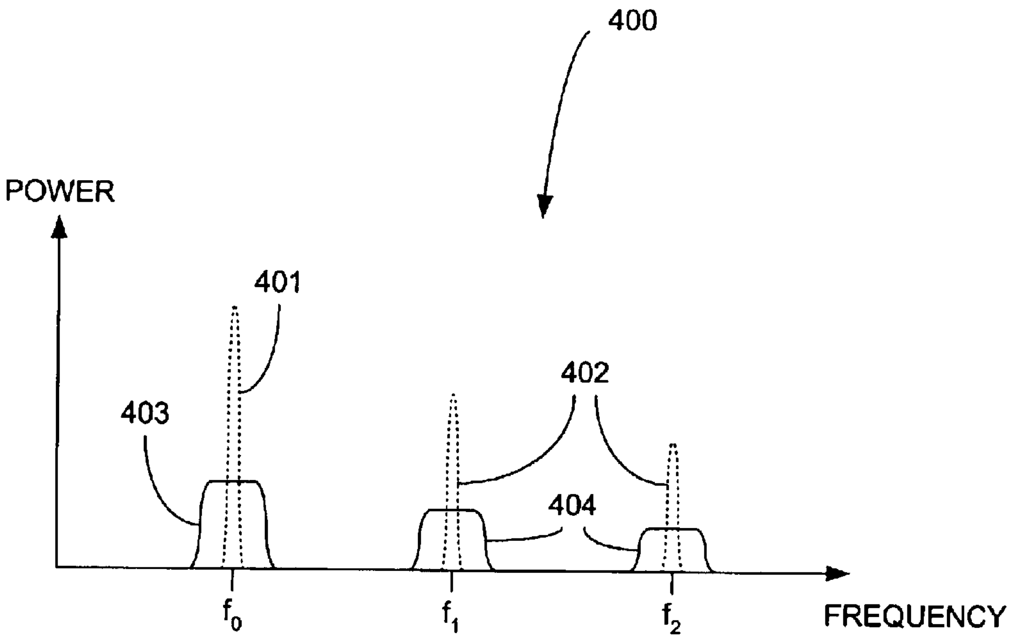
FIG. 5 is a simplified power spectral density graph representing the expected reduction in EMI of a voltage inverter by modulation of the oscillating signal employed in a portion of a switching control circuit according to an embodiment of the invention.

The effect of embodiments of the invention on the power spectral density of a voltage inverter utilizing the above-described switching control circuit is shown by way of a simplified frequency spectrum chart 400 in FIG. 5. The dashed waveform indicates the typical power spectral density of a voltage inverter using an unmodulated oscillating signal, consisting of a spike 401 at a fundamental frequency $f_0$, which is the frequency at which the unmodulated oscillating signal operates. Assuming that the unmodulated oscillating signal is not a perfect sinusoidal wave, spikes 402 at harmonics of the fundamental frequency, shown in FIG. 5 as $f_1$, and $f_2$, will also be present. As discussed above, the magnitude of the power of the unmodulated oscillating signal at those frequencies $f_0$, $f_1$, $f_2$ is often at sufficiently high levels to cause improper operation of electrical circuits near the voltage inverter by way of EMI.

Conversely, the magnitude of the power spectral density of the voltage inverter when driven by an embodiment of a switching control circuit of the present invention are much reduced in comparison to those in which an unmodulated oscillating signal is used. Denoted by the fundamental “bump” 403 and the harmonic bumps 404 in FIG. 5, the reduced magnitude of the power spectral density is accomplished by the randomized nature of the modulation performed by embodiments of the invention. This modulation spreads out the frequency range of the fundamental and harmonic frequencies of the oscillating signal 60 while limiting that range of frequencies based on the requirements of the voltage inverter being driven by the switching control circuits of the present invention.

Generally, the specific embodiments discussed above employ the varying nature of the voltage of the randomized signal 40 to ultimately vary the frequency of the oscillating signal 60 to reduce the EMI generated. Signals which exhibit other randomly or pseudorandomly varying characteristics may also be used. For example, a randomized signal 40 with a randomly varying frequency may be utilized to modulate the frequency of the oscillating signal 60. The frequency range converter 20 would then be required to detect the changes in frequency of the randomized signal 40, and produce a frequency modulation signal 50 based on the frequency of the randomized signal 40. As in the embodiments discussed above, the frequency range converter 20 would also be tasked with ensuring that the frequency modulation signal 50 does not force the frequency of the oscillating signal 60 beyond its acceptable range. Additionally, other varying characteristics of a randomized signal, such as current or phase, could also be employed as the randomized variable used for modulation purposes.

Figure 6:
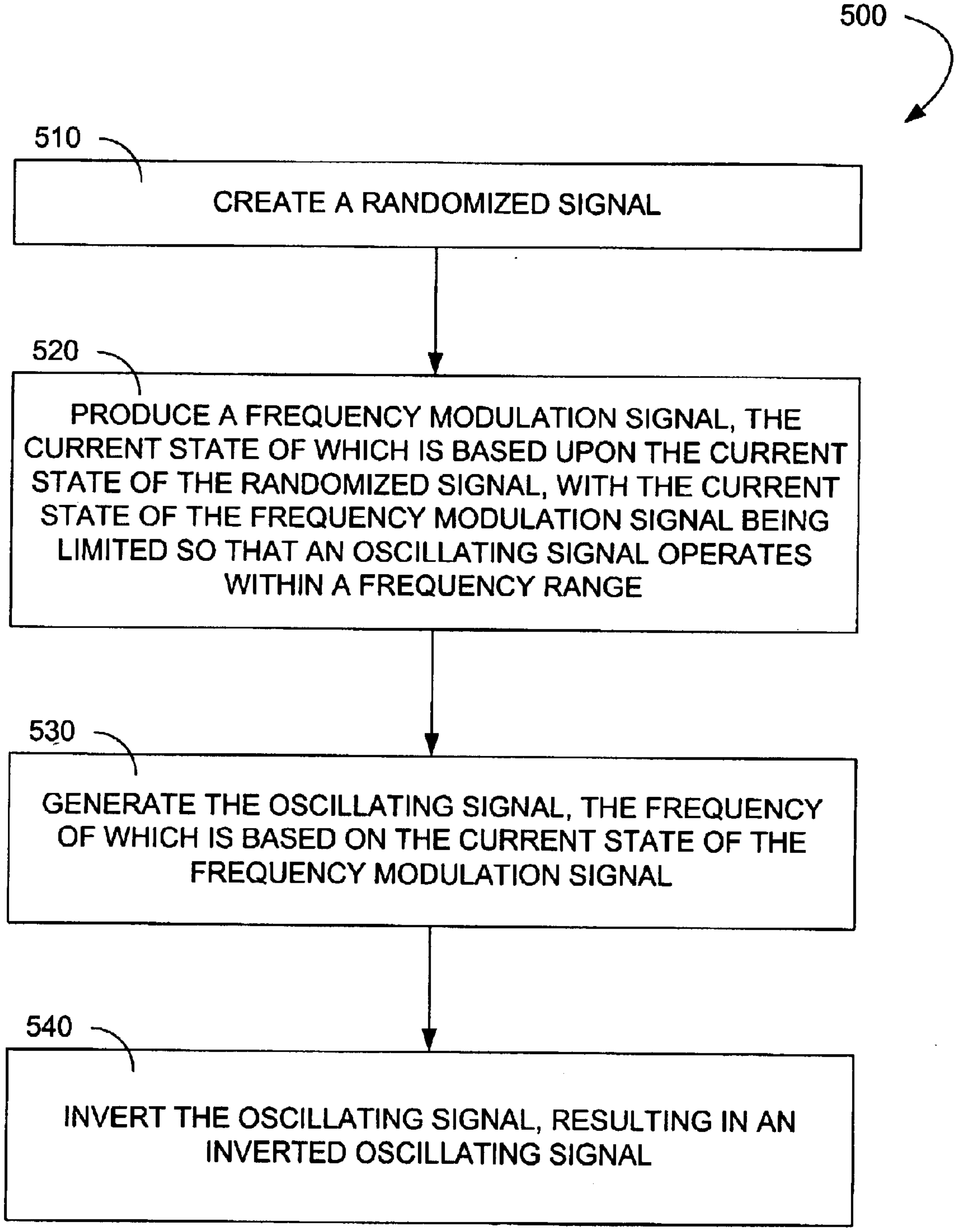
FIG. 6 is a flow diagram of a method according to an embodiment of the invention of generating an oscillating signal and its inverter counterpart for controlling a voltage inverter.

Embodiments of the present invention may also take the form of a method of driving a voltage inverter exhibiting reduced EMI. As shown in FIG. 6, such a method 500 involves creating a randomized signal is (step 510), with some characteristic of that signal, such as amplitude, frequency, or the like, being randomized. Also, as noted above, the randomized signal may be a randomized analog signal or a series of digital input values. A frequency modulation signal, which is based on the current state of the randomized signal, is then produced (step 520). The oscillating signal, the frequency of which is based on the current state of the frequency modulation signal, is then generated (step 530). Further, the frequency modulation signal is limited to ensure the operation of the oscillating signal within a specified frequency range (also step 520), which may be predetermined or modifiable. Finally, the oscillating signal is logically inverted, resulting in an inverted oscillating signal (step 540). Both the oscillating signal and the inverted oscillating signal are then used to drive the voltage inverter, as described earlier.

Figure 7:
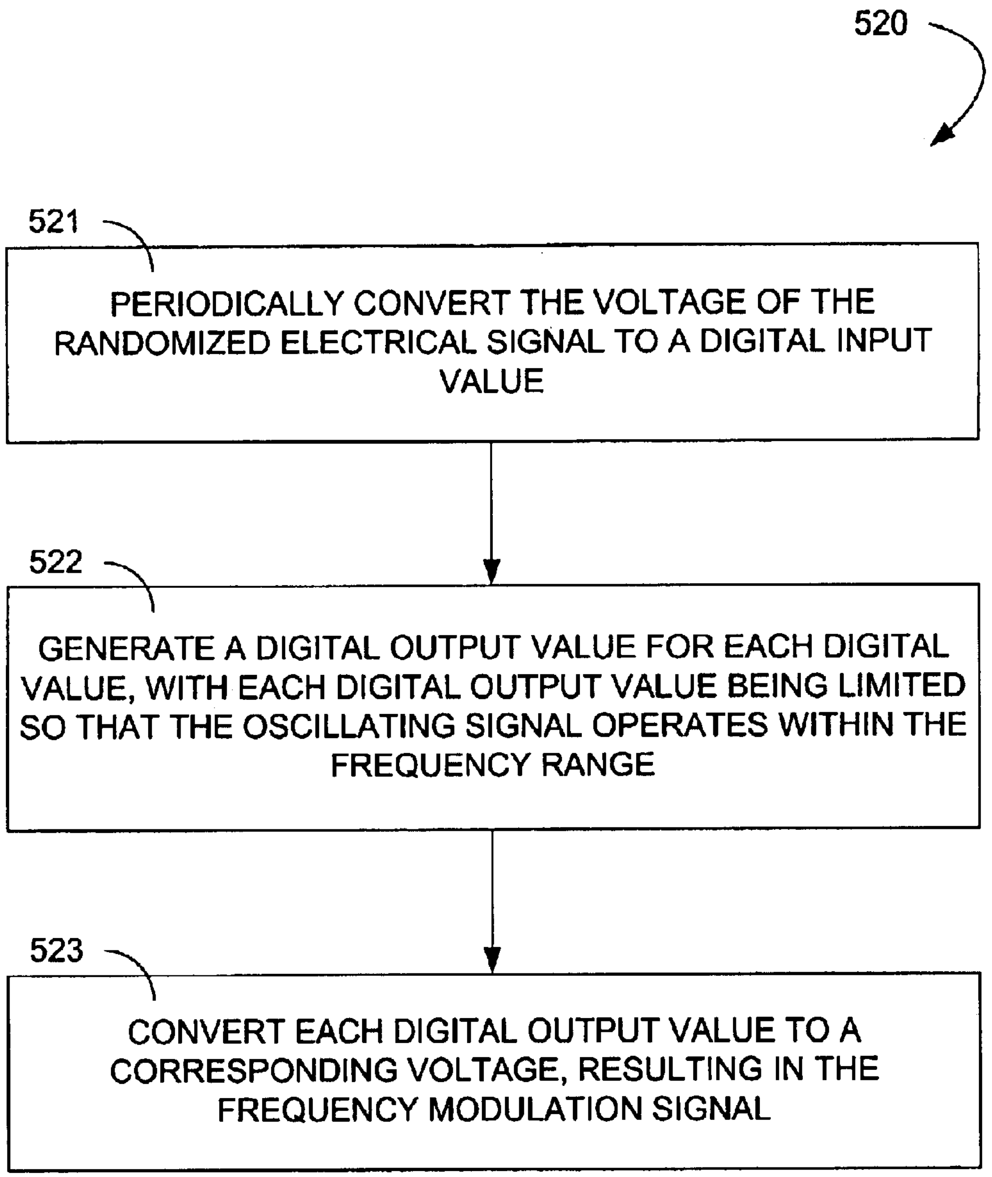
FIG. 7 is a flow diagram further describing the method step of producing a frequency modulation signal from FIG. 6 according to an embodiment of the invention.

In the case of the randomized signal being a randomized analog signal whose voltage exhibits random or pseudorandom behavior, the step of producing the frequency modulation signal (step 520 of FIG. 6) begins with periodically converting the voltage of the randomized signal to a digital input value (step 521 of FIG. 7). A digital output value for each digital input value is then generated (step 522), with each digital output value being limited so that the oscillating signal will operate within the specified frequency range. Methods such as clipping and scaling, described above, as well as others, may be employed. Each of the digital output values is then converted to a corresponding voltage, resulting in the frequency modulation signal (step 523). In the case that the randomized signal is a series of digital input values, the periodically converting step (step 531) would be unnecessary.

In alternate method embodiments, the frequency modulation signal may be held constant at times, causing the oscillating signal to operate at a single frequency, as discussed above.

Again, other method embodiments involving randomized signals possessing different characteristics other than voltage having a randomized quality may be employed, including current, frequency, and phase.

From the foregoing, embodiments of the invention provide an improved switching control circuit and method for a voltage inverter that exhibits reduced EMI, thereby inflicting less noise upon surrounding circuits. Embodiments of the invention other than those shown above are also possible. As a result, the invention is not to be limited to the specific forms so described and illustrated; the invention is limited only by the claims.

What is claimed is:

1. A switching control circuit for a voltage inverter that produces reduced electromagnetic interference, the switching control circuit comprising:

a randomized signal generator configured to create a randomized signal;

a variable frequency oscillator configured to generate an oscillating signal, the frequency of the oscillating signal being based on a current state of a frequency modulation signal;

a frequency range converter configured to produce the frequency modulation signal, the current state of the frequency modulation signal being based upon a current state of the randomized signal, the frequency range converter limiting the current state of the frequency modulation signal so that the oscillating signal operates within a frequency range; and a logic inverter configured to invert the oscillating signal, resulting in an inverted oscillating signal, the oscillating signal and the inverted oscillating signal being used to drive the voltage inverter.

2. The switching control circuit of claim 1, wherein the variable frequency oscillator is a voltage-controlled oscillator (VCO), the VCO generating the oscillating signal whose frequency is based on the voltage of the frequency modulation signal.

3. The switching control circuit of claim 1, wherein the randomized signal is a randomized analog signal, the voltage of which varies with time.

4. The switching control circuit of claim 3, wherein the randomized signal generator is a Josephson junction.

5. The switching control circuit of claim 3, wherein the randomized signal generator is a Chua's oscillator.

6. The switching control circuit of claim 3, wherein the frequency range converter comprises:

an analog-to-digital converter (ADC) configured to periodically convert the voltage of the randomized analog signal to a digital input value;

a microcontroller configured to generate a digital output value for each digital input value, with each digital output value being limited so that the oscillating signal operates within the frequency range; and a digital-to-analog converter (DAC) configured to convert each digital output value to a corresponding voltage, resulting in the frequency modulation signal.

7. The switching control circuit of claim 1, wherein the randomized signal comprises a series of randomized digital input values.

8. The switching control circuit of claim 7, wherein the randomized signal generator is a hardware random number generator.

9. The switching control circuit of claim 7, wherein the randomized signal generator is a hardware pseudorandom number generator.

10. The switching control circuit of claim 7, wherein the randomized signal generator is an embedded microcontroller performing a pseudorandom number generation algorithm.

11. The switching control circuit of claim 7, wherein the frequency range converter comprises:

a microcontroller configured to generate a digital output value for each randomized digital input value, with each digital output value being limited so that the oscillating signal operates within the frequency range; and a digital-to-analog converter (DAC) configured to convert each digital output value to a corresponding voltage, resulting in the frequency modulation signal.

12. The switching control circuit of claim 1, wherein the frequency range is predetermined.

13. The switching control circuit of claim 1, wherein the frequency range is modifiable.

14. The switching control circuit of claim 1, wherein the frequency modulation signal is held constant selectably so that the oscillating signal operates essentially at a single frequency.

15. A voltage inverter containing the switching control circuit of claim 1.

16. The voltage inverter of claim 15, wherein the voltage inverter is a Royer inverter having a first and second transistor, the base of the first transistor being driven by the oscillating signal, and the base of the second transistor being driven by the inverted oscillating signal.

17. A switching control circuit for a voltage inverter that produces reduced electromagnetic interference, the switching control circuit comprising:

means for creating a randomized signal;

means for generating an oscillating signal, the frequency of the oscillating signal being based on a current state of a frequency modulation signal;

means for producing the frequency modulation signal, the current state of the frequency modulation signal being based upon a current state of the randomized signal, the producing means limiting the current state of the frequency modulation signal so that the oscillating signal operates within a frequency range; and means for inverting the oscillating signal, resulting in an inverted oscillating signal, the oscillating signal and the inverted oscillating signal being used to drive the voltage inverter.

18. The switching control circuit of claim 17, wherein the randomized signal is a randomized analog signal, the voltage of which varies with time.

19. The switching control circuit of claim 18, wherein the producing means comprises:

means for periodically converting the voltage of the randomized analog signal to a digital input value;

means for generating a digital output value for each digital input value, with each digital output value being limited so that the oscillating signal operates within the frequency range; and means for converting each digital output value to a corresponding voltage, resulting in the frequency modulation signal.

20. The switching control circuit of claim 17, wherein the randomized signal comprises a series of randomized digital input values.

21. The switching control circuit of claim 20, wherein the producing means comprises:

means for generating a digital output value for each randomized digital input value, with each digital output value being limited so that the oscillating signal operates within the frequency range; and means for converting each digital output value to a corresponding voltage, resulting in the frequency modulation signal.

22. The switching control circuit of claim 17, wherein the frequency range is predetermined.

23. The switching control circuit of claim 17, wherein the frequency range is modifiable.

24. The switching control circuit of claim 17, wherein the frequency modulation signal is held constant selectably so that the oscillating signal operates essentially at a single frequency.

25. A voltage inverter containing the switching control circuit of claim 17.

26. The voltage inverter of claim 25, wherein the voltage inverter is a Royer inverter having a first and second transistor, the base of the first transistor being driven by the oscillating signal, and the base of the second transistor being driven by the inverted oscillating signal.

27. A method for driving a voltage inverter that produces reduced electromagnetic interference, the method comprising:

creating a randomized signal;

generating an oscillating signal, the frequency of the oscillating signal being based on a current state of a frequency modulation signal;

producing the frequency modulation signal, the current state of the frequency modulation signal being based upon a current state of the randomized signal, the producing step limiting the current state of the frequency modulation signal so that the oscillating signal operates within a frequency range; and inverting the oscillating signal, resulting in an inverted oscillating signal, the oscillating signal and the inverted oscillating signal being used to drive the voltage inverter.

28. The method of claim 27, wherein the randomized signal is a randomized analog signal, the voltage of which varies with time.

29. The method of claim 28, wherein the producing step comprises:

periodically converting the voltage of the randomized analog signal to a digital input value;

generating a digital output value for each digital input value, with each digital output value being limited so that the oscillating signal operates within the frequency range; and converting each digital output value to a corresponding voltage, resulting in the frequency modulation signal.

30. The method of claim 27, wherein the randomized signal comprises a series of randomized digital input values.

31. The method of claim 30, wherein the producing step comprises:

generating a digital output value for each randomized digital input value, with each digital output value being limited so that the oscillating signal operates within the frequency range; and converting each digital output value to a corresponding voltage, resulting in the frequency modulation signal.

32. The method of claim 27, wherein the frequency range is predetermined.

33. The method of claim 27, wherein the frequency range is modifiable.

34. The method of claim 27, wherein the frequency modulation signal is held constant selectably so that the oscillating signal operates essentially at a single frequency.

* * * * *